United States Patent [19]
Kaneko et al.

[11] Patent Number: 6,119,211
[45] Date of Patent: Sep. 12, 2000

[54] CIRCUIT FOR CONTROLLING WRITING DATA INTO MEMORY AND ALLOWING CONCURRENT RESET GENERATION AND WRITING DATA OPERATION

[75] Inventors: Shigeharu Kaneko; Takao Honda, both of Tokyo, Japan

[73] Assignee: NEC Corporation, Japan

[21] Appl. No.: 08/910,021

[22] Filed: Aug. 12, 1997

[30] Foreign Application Priority Data

Aug. 26, 1996 [JP] Japan .................................. 8-223855

[51] Int. Cl.[7] ..................................................... G06F 12/00
[52] U.S. Cl. ........................ 711/166; 711/154; 711/106; 365/189.01; 365/195
[58] Field of Search ........................ 365/189.01, 189.04, 365/228, 229, 195; 711/154, 166, 163, 158, 100, 103, 106

[56] References Cited

U.S. PATENT DOCUMENTS

| | | | |
|---|---|---|---|
| 4,962,487 | 10/1990 | Suzuki | 365/233.5 |
| 5,267,197 | 11/1993 | McClure | 365/189.01 |
| 5,351,216 | 9/1994 | Salt et al. | 365/230.01 |
| 5,457,660 | 10/1995 | Ito | 365/228 |
| 5,574,920 | 11/1996 | Parry | 713/340 |
| 5,748,560 | 5/1998 | Sawada | 365/233 |
| 5,768,190 | 6/1998 | Tanaka et al. | 365/185.22 |
| 5,825,691 | 10/1998 | McClure | 365/189.01 |
| 5,835,706 | 11/1998 | Hikichi et al. | 365/228 |

FOREIGN PATENT DOCUMENTS

| | | | |
|---|---|---|---|
| 59-58843 | 4/1984 | Japan | G06F 1/00 |
| 63-208958 | 8/1988 | Japan . | |
| 63-278156 | 11/1988 | Japan | G06F 12/00 |
| 2184947 | 7/1990 | Japan | G06F 12/16 |
| 2297682 | 12/1990 | Japan | G06F 15/78 |
| 2310786 | 12/1990 | Japan | G06F 15/78 |
| 5-27875 | 2/1993 | Japan | G06F 1/24 |

Primary Examiner—John W. Cabeca
Assistant Examiner—Pierre M. Bataille
Attorney, Agent, or Firm—Hayes, Soloway, Hennessey, Grossman & Hage, P.C.

[57] ABSTRACT

There is provided a circuit for controlling writing data into an address of a memory, the data and address being transmitted from a central processing unit, the circuit (a) latching address and data transmitted from the central processing unit, (b) storing a first signal transmitted from the central processing unit, (c) writing latched data into a latched address of the memory by a second signal associated with the first signal, and (d) invalidating the second signal after a period of time necessary for writing data into the address has passed. The above mentioned circuit makes sure that writing data into a memory can be completed without destruction of the data, even if a reset factor is generated while data is being written into a memory. In addition, reset timing for an entire device in which the above mentioned circuit is contained is not out of phase, ensuring prevention of malfunction of the device.

10 Claims, 11 Drawing Sheets

CIRCUIT FOR CONTROLLING WRITING DATA INTO MEMORY AND ALLOWING CONCURRENT RESET GENERATION AND WRITING DATA OPERATION

BACKGROUND OF THE INVENTION

1. Field of the Invention

The invention relates to a circuit for controlling writing data to a memory, and more particularly to such a circuit to be used for a micro-computer storing a memory therein.

2. Description of the Related Art

A circuit for controlling writing data to a memory has been used for preventing data to be written into a memory from being destroyed and further for protecting the data when a reset factor is generated while the data is being written into a memory. One of such circuits has been suggested in Japanese Unexamined Patent Publication No. 63-208958.

FIG. 1 is a block diagram illustrating a structure of a conventional circuit for controlling writing data to a memory. A central processing unit (hereinafter, referred to simply as "CPU") 95 transmits a data signal 90 and a memory reading signal 91 to a memory 96. CPU 95 transmits a memory writing signal 92 to a memory control signal control section 97 while data is being written into the memory 96, and the control section 97, on receiving the memory writing signals 92, determines whether transmittance of signals to the memory 96 is allowed or inhibited. A section 98 judges whether data is now being written into or being read from the memory 96, and stops transmission of reset-allowing signals 99 to a reset signal generator 100 while data is actually being written into or being read from the memory 96. The reset signal generator 100, when a reset factor is generated, would transmit a reset signal 94, if the reset-allowing signal 99 were in allowed condition. If the reset-allowing signal 99 is in inhibited condition, the reset signal generator 100 would not transmit the reset signals 94 until the reset-allowing signal 99 enters allowed condition.

The illustrated circuit operates as follows. FIG. 2 illustrates wave-forms of the signals 92, 99 and 94. If a reset factor is not generated, the reset signal 94 is not transmitted in the circuit illustrated in FIG. 1, and hence data is able to be always written into the memory 96. If the time $T_R$ at which a reset factor has been generated is within a period when CPU 95 is writing data into the memory 96, since the memory writing signal 92 is valid, the section 98 causes the reset-allowing signal 99 to have an inhibition value in order to prevent production of the reset signals 94. Suppose that CPU 95 has completed writing data into the memory 96 at the time Ts while the reset signals 94 are prevented from being produced. Since the memory-writing signal 92 is invalidated, the section 98 causes the reset-allowing signal 99 to have an allowance value. As a result, the reset signal 94, which has been prevented from being produced, is produced, and thus, reset of the circuit is carried out. Thus, a reset does not take place while data is being written into the memory, and hence a period of time necessary for data to be written into the memory is guaranteed, and it is made sure that no error data is written into the memory.

However, the above mentioned conventional circuit has a problem as follows. If the reset signal 94 produced in the circuit illustrated in FIG. 1 is used as a reset signal for CPU 95 or other circuits, timing at which reset is carried out is different between a case where an external reset factor overlaps the memory-writing signal and a case where an external reset factor does not overlap the memory-writing signal. Accordingly, a system including a micro-computer having the above mentioned circuit for controlling writing data into a memory may induce malfunction.

The reason is that there is a possibility that a period of time where only a micro-computer is not reset may occur in a system including a micro-computer having the above mentioned conventional circuit.

A typical example thereof is described hereinbelow. In general, a period of time necessary for a non-volatile memory to write data thereinto is quite longer than that of DRAM and SRAM. Specifically, it takes tens of $\mu$ sec or longer for writing data into a non-volatile memory. In a circuit system employing a general semiconductor integrated circuit, a reset duration is in the range of 10 $\mu$ sec to tens of $\mu$ sec at minimum, though a reset duration depends on an operation frequency of the circuit. When such a memory is used, a valid reset duration transmitted from outside may be shorter than a period of time for writing. Hence, it may occur depending on the overlapping timing that an external reset signal is input while data is being written into a memory, and the external reset signal is determined valid, and that writing is not completed yet when the external reset signal is invalidated after a certain valid duration has passed. Hence, there exists a period of time in which a micro-computer is not reset, even after a valid reset duration has passed.

SUMMARY OF THE INVENTION

In view of the foregoing problem of the conventional circuit, it is an object of the present invention to provide a circuit for controlling writing data into a memory, which circuit is capable of properly writing data into a memory without destruction of the data, even if a reset signal is transmitted thereinto while data is being written into a memory, guaranteeing proper operation of writing data into a memory with proper reset timing being kept, and preventing malfunction of a device including the circuit.

There is provided a circuit for controlling writing data into an address of a memory, the data and address being transmitted from a central processing unit, the circuit having functions of latching address and data transmitted from the central processing unit, storing a first signal transmitted from the central processing unit, writing latched data into a latched address of the memory by a second signal associated with the first signal, and invalidating the second signal after a period of time necessary for writing data into the address has passed.

There is further provided a circuit for controlling writing data into an address of a memory, the data and address being transmitted from a central processing unit, the circuit including (a) a judgement circuit for judging whether writing data into an address is completed, and (b) a status flag for inhibiting or allowing data to be written into the address, the judgement circuit and status flag being not initialized by a reset, but initialized only when power is applied to the circuit, the judgement circuit and status flag carrying out writing data into the address when a reset and writing data into the address coexist with each other, to ensure that other elements of the circuit are reset at the same time when a reset factor is generated.

Specifically, the above mentioned circuit includes (a) a judgement circuit for judging whether writing data into an address is completed, the judgement circuit invalidating a first signal transmitted therefrom while a second signal introduced thereto from the central processing unit is valid, and validating the first signal when a period of time necessary for writing data into an address has passed, if a reset signal is received while the second signal is valid, the second signal being a signal instructing to write data into an address and the first signal being a signal instructing to terminate writing data into an address, (b) a status flag for transmitting a third signal which is a signal allowing to write data into an address, the status flag being set on receiving the second signal, to thereby validate the third signal, and being reset on receiving valid first signal from the judgement circuit, to thereby invalidate the third signal, (c) address latch and data latch latching an address transmitted from the central processing unit and data to be written into the thus transmitted address, respectively, each time they are transmitted from the central processing unit, the address and data latches writing the data into the address by valid third signal, and (d) a reset signal transmitter transmitting a reset signal to reset circuit elements required to be reset other than the judgement circuit, the status flag and the address and data latches.

It is preferable that the judgement circuit and the status flag are reset when power supply is introduced thereinto. It is also preferable that the reset signal transmitter transmits a power-on reset signal to the judgement circuit and the status flag to thereby reset them when power supply is introduced thereinto. The judgement circuit may include a timer for measuring the period of time necessary for writing data into an address.

The circuit in accordance with the invention may further include an OR circuit for calculating logical sum of the first signal and the power-on reset signal, and transmitting a fourth signal representing the logical sum to the status flag. The status flag may be designed to validate the third signal on receiving valid second signal, and invalidate the third signal on receiving valid fourth signal.

It is preferable that even if an external reset factor is generated, the address and data latches retain address and data received immediately before the external reset factor has been generated.

The circuit may further comprise a clock oscillator and a device for stopping oscillation of the clock oscillator while reset factors are generated. Specifically, the device may be designed to calculate logical product of the third signal having been invalidated and the reset signal, and transmit a fifth signal for stopping oscillation of the clock oscillator while reset factors are generated.

The circuit may further include a selector for selecting one of first and second combinations: first combination comprising an address signal, a data signal, and the second signal all transmitted to the selector from the central processing unit; second combination comprising an address signal, a data signal, and a signal corresponding to the second signal all transmitted from other semiconductor integrated circuit units or from outside.

In the above mentioned circuit, when power is introduced into the circuit, the reset signal transmitter transmits a power-on reset signal to thereby reset or initialize the status flag and the judgement circuit. Except when power is introduced into the circuit, the status flag is set only by the second signal, and reset only by the first signal transmitted from the judgement circuit. Namely, a value which the status flag has is not changed by a reset signal in a device containing the circuit. Hence, it is possible to know by the status flag that it is in writing condition.

Since the judgement circuit is not reset by a reset signal in a device, the second signal is kept valid during a period of time which is satisfactory with a standard of a memory, regardless of presence or absence of a reset introduced thereinto. Hence, it is possible to write data into a memory with applying a reset to circuits other than a memory.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
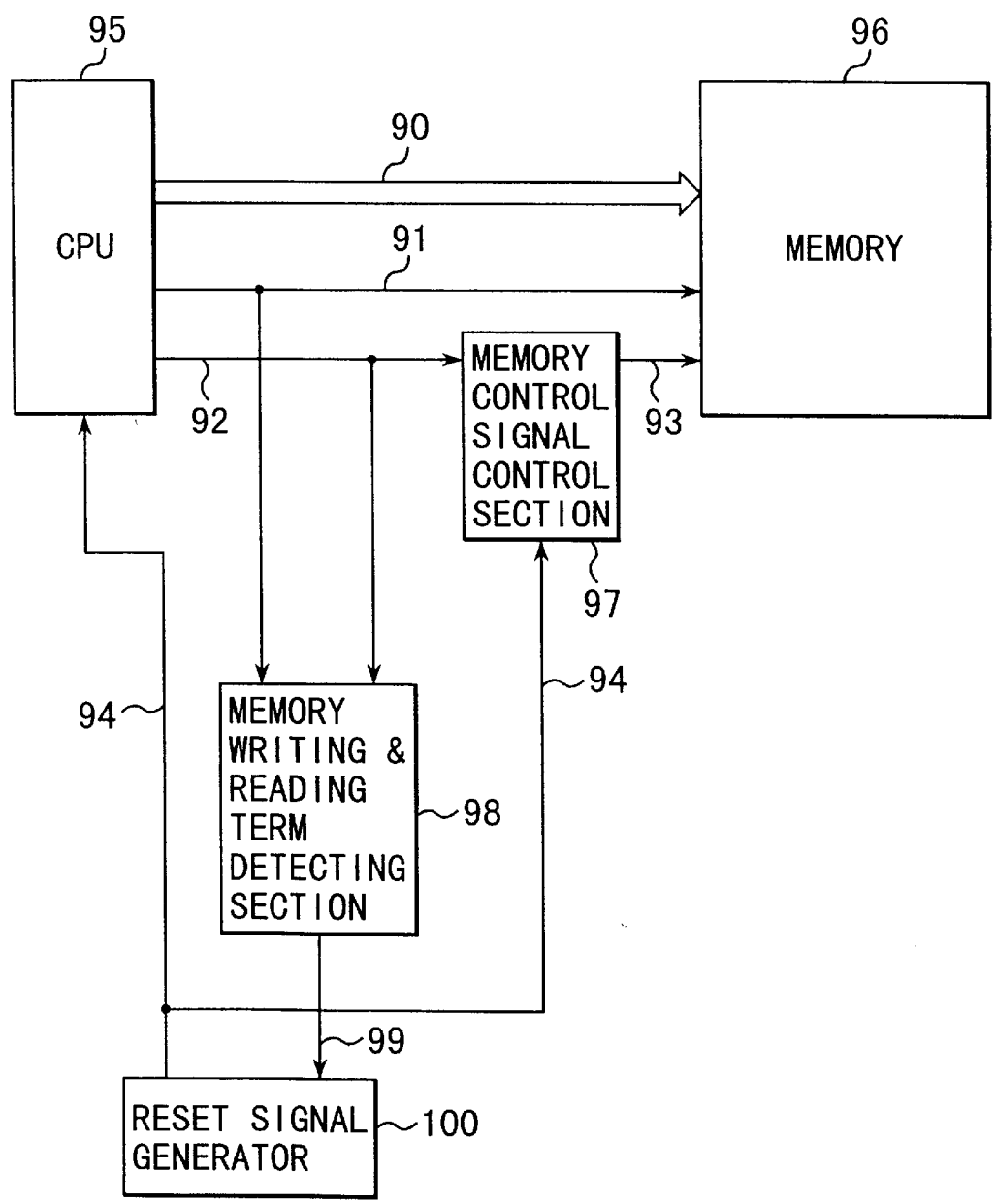
FIG. 1 a block diagram of a conventional circuit for controlling writing data into memory.
Figure 2:
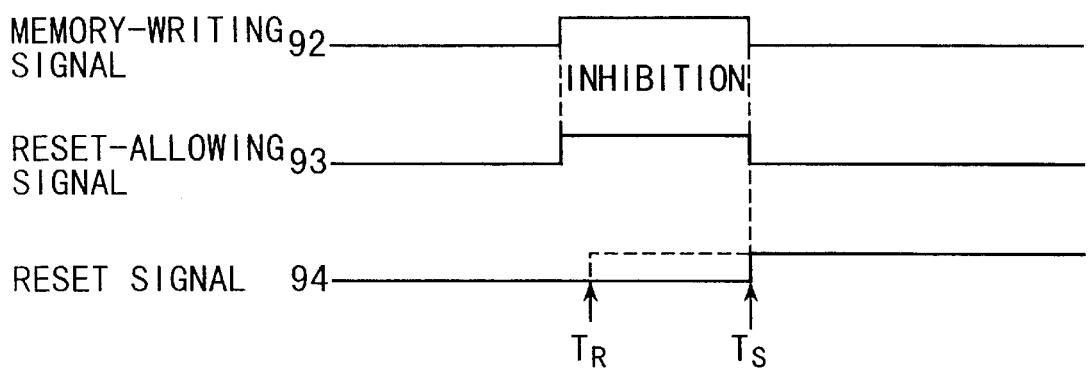
FIG. 2 illustrates wave-forms of signals in the circuit illustrated in FIG. 1.
Figure 3:
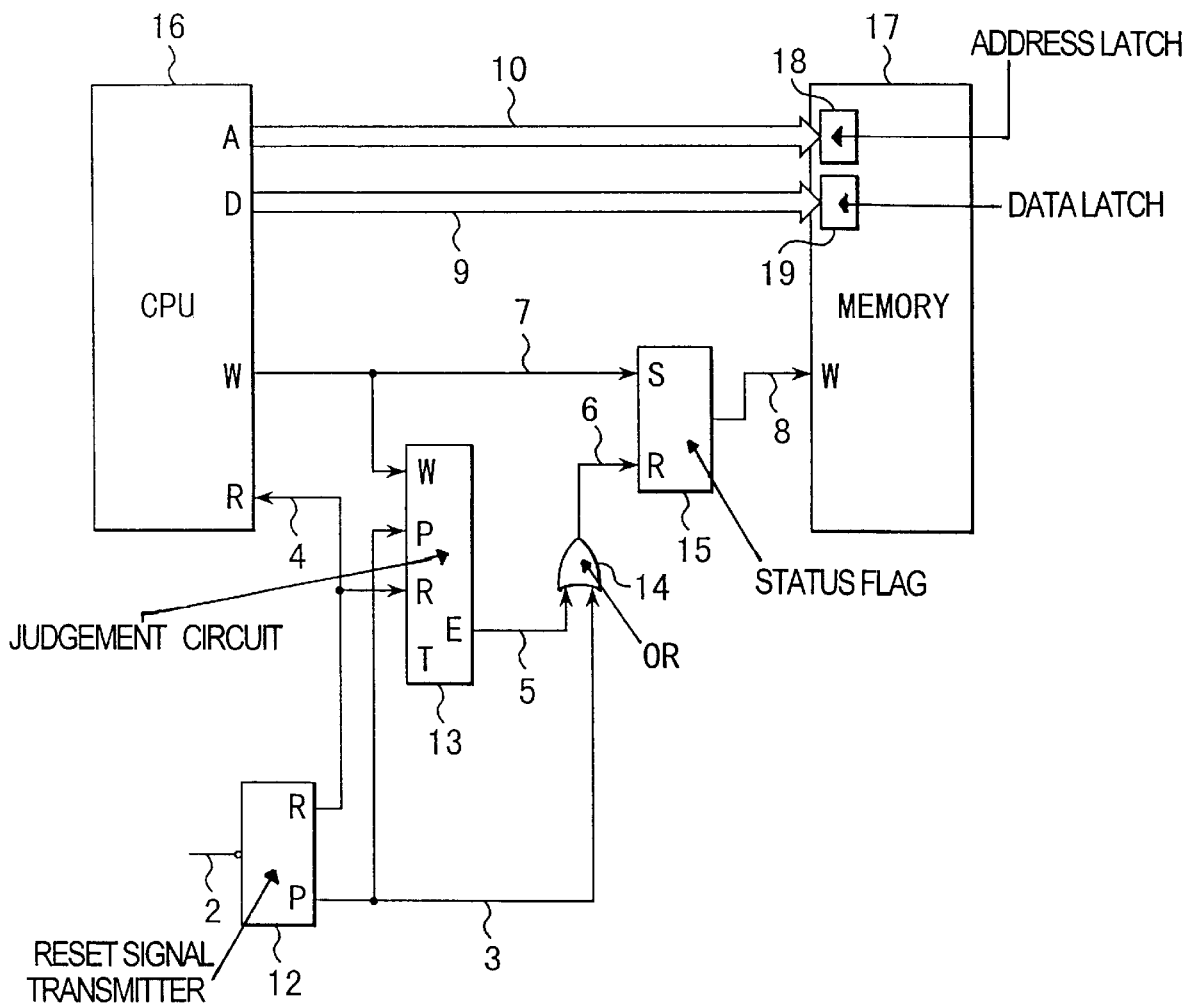
FIG. 3 is a block diagram of a circuit for controlling writing data into a memory in accordance with the first embodiment of the present invention.

A circuit for controlling writing data into a memory to be used for a semiconductor integrated circuit, in accordance with the first embodiment of the invention is explained hereinbelow with reference to FIGS. 3, 4, 5A, 5B and 6. FIG. 3 is a block diagram of the circuit in accordance with the first embodiment.

The circuit for controlling writing data into a memory to be used for a semiconductor integrated circuit includes a reset signal transmitter 12, a judgement circuit 13 for judging whether writing data into a memory is completed, a status flag 15, and an OR circuit 14. A central processing unit (hereinafter, referred to as "CPU") 16 is connected to a memory 17 through the circuit.

The reset signal transmitter 12 receives a reset factor (negative logic) 2 as an input from outside, and transmits either a reset signal 4 or a power-on reset signal 3. Herein, the reset signal 4 is a signal for resetting the circuit when the circuit operates in normal condition, whereas the power-on reset signal 3 is transmitted only when electric power is applied to the circuit.

CPU 16 transmits an address signal 10 and a data signal 9 to the memory 17. CPU 16 also transmits a signal 7 for instructing to write data into the memory 17 (hereinafter, the signal 7 is referred to as "memory-writing signal"). The memory-writing signal 7 is transmitted to the judgement circuit 13 and a set terminal of the status flag 15.

The judgement circuit 13 has a function of measuring how much time has gone by. That is, the judgement circuit 13 includes a timer T therein. The judgement circuit 13 transmits a signal 5 for instructing to terminate writing data into the memory 17 (hereinafter, the signal 5 is referred to as "memory-writing termination signal"). The judgement circuit 13 is reset by the power-on reset signal 3, and judges whether writing data into the memory 17 is completed or not, based on both the memory-writing signal 7 and a period of time having passed after the reset signal 4 and the memory-writing signal 7 had been transmitted into the judgement circuit 13. As mentioned earlier, the period of time is measured by the judgement circuit 13. When the judgement circuit 13 judges that writing data into the memory 17 has been completed, the judgement circuit 13 validates the memory-writing termination signal 5.

The OR circuit 14 calculates logic sum of the power-on reset signal 3 and the memory-writing termination signal 5, and transmits a signal 6 to a reset terminal R of the status flag 15.

The status flag 15 transmits a signal 8 instructing to allow to write data into the memory 17 (hereinafter, the signal 8 is referred to as "memory-writing allowance signal"). The status flag 15 validates the memory-writing allowance signal 8 to be transmitted therefrom, if the memory-writing signal 7 transmitted to a set terminal S thereof becomes valid, and invalidates the memory-writing allowance signal 8, if the signal 6 transmitted to the reset terminal R becomes valid.

If the memory-writing allowance signal 8 transmitted to a write terminal W of the memory 17 becomes valid, the memory 17 writes data stored in a data latch 19 into an address stored in an address latch 18. Both the address latch 18 and the data latch 19 retain data having been written thereinto, while the memory-writing allowance signal 8 is valid, regardless of the presence or absence of the reset signal 4. Hence, values stored in the address latch 18 and the data latch 19 remain unchanged, even if CPU 16 is reset by the reset signal 4 and thus values represented with the address signal 10 and the data signal 9 are changed.

The operation of the circuit illustrated in FIG. 3 is explained hereinbelow with reference to FIGS. 4, 5A, 5B and 6 each illustrating a wave-form of each of the above mentioned signals.

Figure 4:
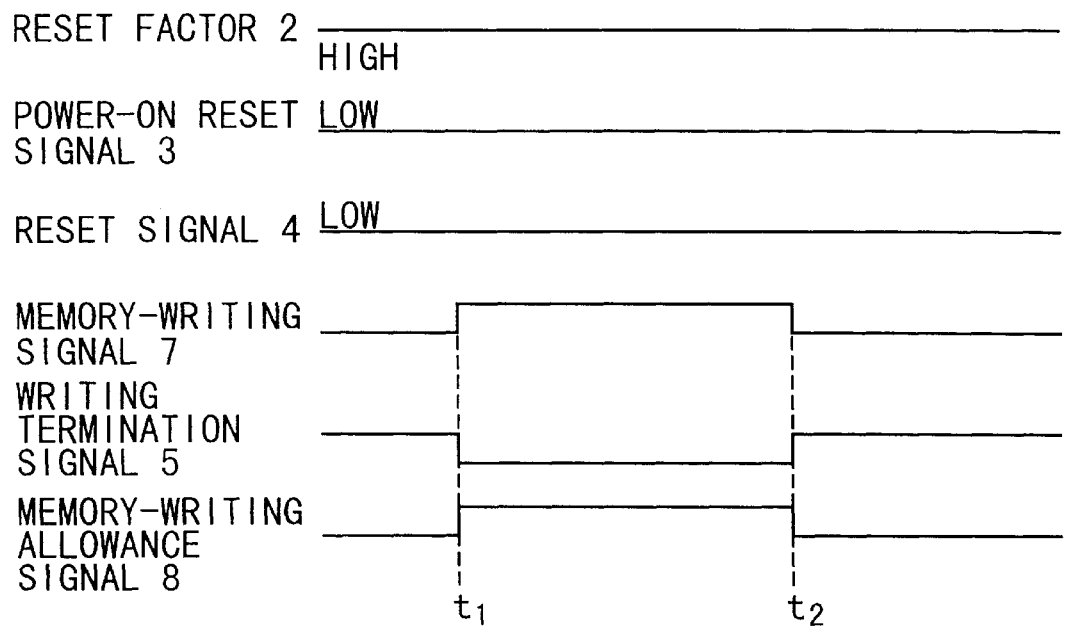
FIG. 4 illustrates wave-forms of signals in the circuit illustrated in FIG. 3, to be found when a reset factor is not generated.

FIG. 4 illustrates wave-forms of the signals to be found when a reset factor (negative logic) 2 is not generated. When CPU 16 writes data into the memory 17, CPU 16 first transmits the address signal 10 and the data signal 9, and then the address latch 18 and the data latch 19 of the memory 17 receive and retain data represented with the signals. Then, CPU 16 transmits the memory-writing signal 7 at time $t_1$ to thereby set the status flag 15. Thus, the memory-writing allowance signal 8 is transmitted from the status flag 15 to the memory 17, and then data stored in the data latch 18 is written into an address stored in the address latch 18.

When the memory-writing signal 7 becomes invalid, the judgement circuit 13 validates the memory-writing termination signal 5. Hence, the status flag 15 is reset through the OR circuit 14, and thus the memory-writing allowance signal 8 becomes invalid. Thus, the operation of writing data into the memory 17 is completed.

Figure 5A:
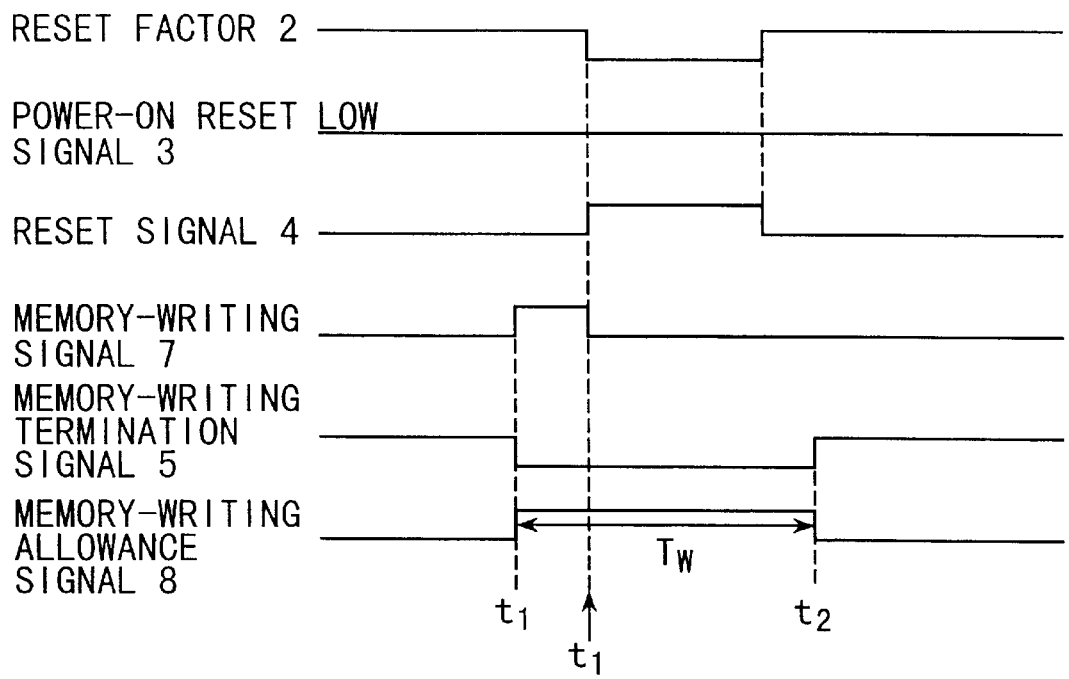
FIG. 5A illustrates wave-forms of signals in the circuit illustrated in FIG. 3, to be found when a reset factor is generated.
Figure 5B:
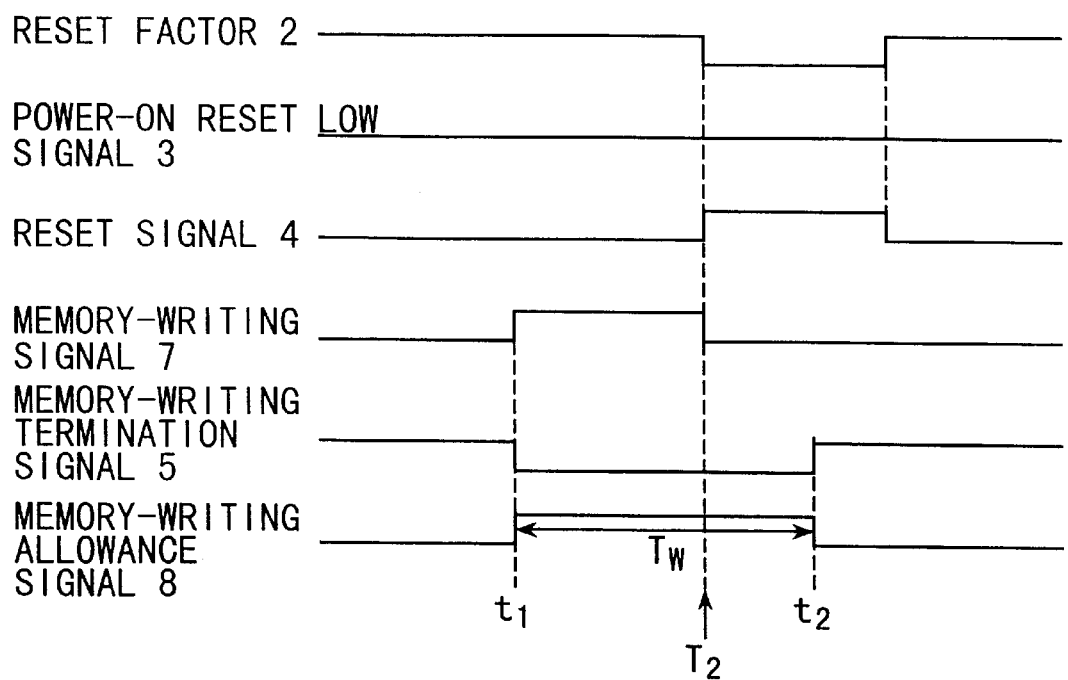
FIG. 5B illustrates wave-forms of signals in the circuit illustrated in FIG. 3, to be found when a reset factor is generated and lasts after writing has been completed.

If a reset factor 2 is generated while data is being written into the memory 17, wave-forms of the signals in the circuit illustrated in FIG. 3 are those as illustrated in FIG. 5A or FIG. 5B.

With reference to FIG. 5A, when the memory-writing signal 7 becomes valid at time $t_1$, writing data into the memory 17 is carried out in the same way as FIG. 4. If a reset factor 2 is generated while data is being written into the memory 17, for instance, at time $t_1$ at which the memory-writing signal 7 is valid, the reset signal 4 becomes valid with the result that CPU 16 is reset and that all of the address signal 10, data signal 9 and memory-writing signal 7 are reset.

However, since the judgement circuit 13 receives the reset signal 4 to thereby know that a reset factor 2 is generated while data is being written into the memory 17, the judgement circuit 13 determines time $t_2$ at which writing data into the memory 17 will be completed, based on a period of time Tw necessary for data to be written into the memory 17. The period of time Tw is measured by the judgement circuit 13 from the time at which the memory-writing signal 7 has just become valid. At the time $t_2$, the judgement circuit 13 validates the memory-writing termination signal 5. When the memory-writing termination signal 5 becomes valid, the status flag 15 is reset by the signal 6. Hence, the memory-writing allowance signal 8 is invalidated, and thereby the operation of writing data into the memory 17 is completed.

The address latch 18 and the data latch 19 of the memory 17 are not influenced by the reset signal 4, it would be possible to write data into a correct address, even if the reset signal 4 is generated while data is being written into the memory 17. In addition, the address latch 18 and the data latch 19 retains a value stored therein even after a reset is carried out, it would be possible to know that a reset has been carried out after which data had been written into which address.

The operation illustrated in FIG. 5B is the same as the operation illustrated in FIG. 5A except that a period of time in which the memory-writing signal 7 is valid is different from that of FIG. 5A, because the timing $T_2$ at which a reset factor is generated is different from the timing $T_2$ in FIG. 5A, and that the timing at which the reset signal 4 becomes invalid is different from that of FIG. 5A, because the reset factor 2 is still valid even after writing data into the memory 17 has been completed.

Figure 6:
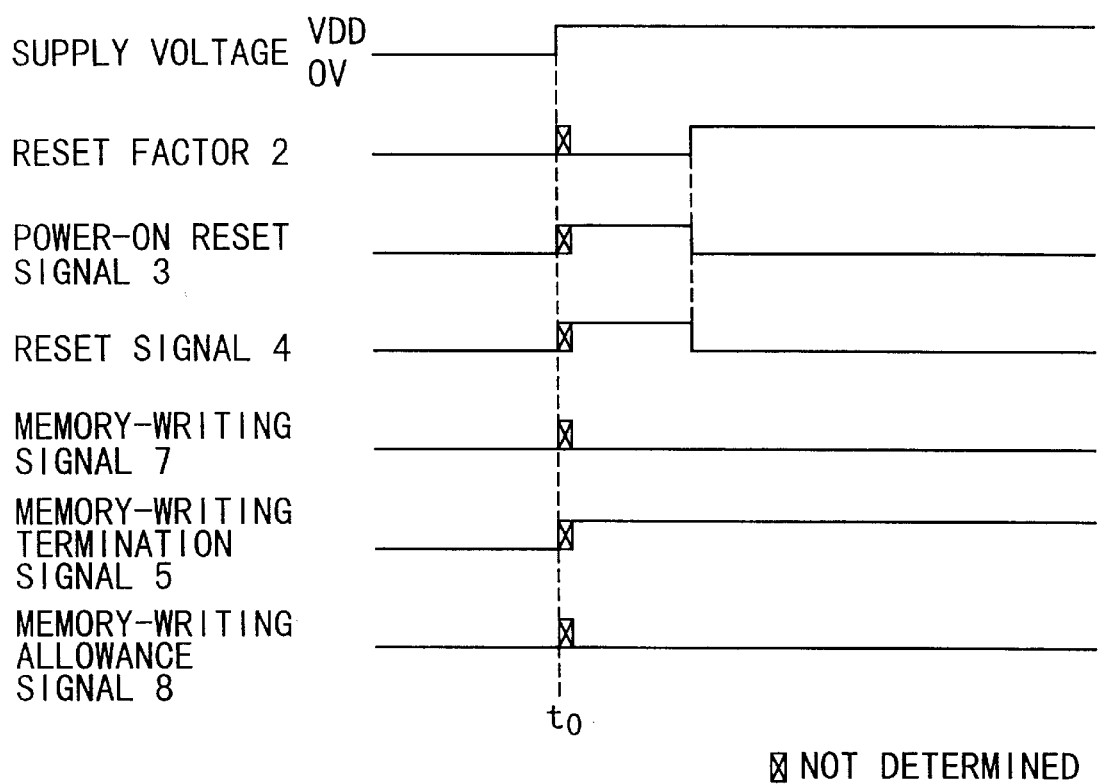
FIG. 6 illustrates wave-forms of signals in the circuit illustrated in FIG. 3, to be found when power supply is just introduced thereinto.

FIG. 6 illustrates wave-forms of the signals to be found when power supply is applied to the circuit illustrated in FIG. 3.

The judgement circuit 13 and the status flag 15 both of which are not reset by the reset signal 4 have to be reset at time $t_0$ at which a system including the circuit illustrated in FIG. 3 is turned on. Hence, they are reset by the power-on reset signal 3 transmitted from the reset signal transmitter 12 only when a reset is to be carried out immediately after electric power is applied to the circuit. At the same time when electric power is applied to the circuit, the reset factor 2 is input to the reset signal transmitter 12. On receiving the reset factor 2, the reset signal transmitter 12 transmits the reset signal 4 to thereby invalidate the memory-writing signal 7, validate the memory-writing termination signal 5, and invalidate the memory-writing allowance signal 8. The reset factor 2 is invalidated some time later with the result that the reset signal 4 is also invalidated.

In the above mentioned first embodiment, the status flag 15 is set by the memory-writing signal 7 transmitted from CPU 16. However, the status flag 15 keeps the previous condition, even if CPU 16 is reset and thus the memory-writing signal 7 is invalidated, and keeps data to be written into the memory 17 until the judgement circuit 13 transmits the memory-writing termination signal 5. Thus, since there can be accomplished a structure in which the reset signal 4 does not overlap the memory-writing allowance signal 8, it is made sure that data is kept to be written into the memory 17, even if the reset factor 2 is generated while data is being written into the memory 17.

In addition, the judgement circuit 13 surely ensures a period of time satisfactory with the standard about timing at which data is written into the memory 17, which period of time starts at a time at which the memory-writing signal 7 has become valid, even if the reset signal 4 becomes valid while data is being written into the memory 17, and thereafter transmits the memory-writing termination signal 5. Thus, it is ensured that the memory-writing allowance signal 8 to be transmitted to the memory 17 can be cancelled, even if the reset factor 2 is generated at any timing.

Furthermore, since the reset signal transmitter 12 transmits the power-on reset signal 3 which is valid only when power is applied to the circuit, it is possible to reset the status flag 15 and the judgement circuit 13 both of which are not able to be reset by the reset factor 2.

Since the address latch 18 and the data latch 19 of the memory 17 are not influenced by the reset signal 4, even if the memory-writing signal 7 coexists with the reset factor 2, it would be able to know that a reset was carried out after which data had been written into which address, by reading out the address latch 18 and the data latch 19 after the reset was carried out.

A circuit for controlling writing data into a memory in accordance with the second embodiment is explained hereinbelow with reference to FIGS. 7, 8, 9A, 9B and 10.

Figure 7:
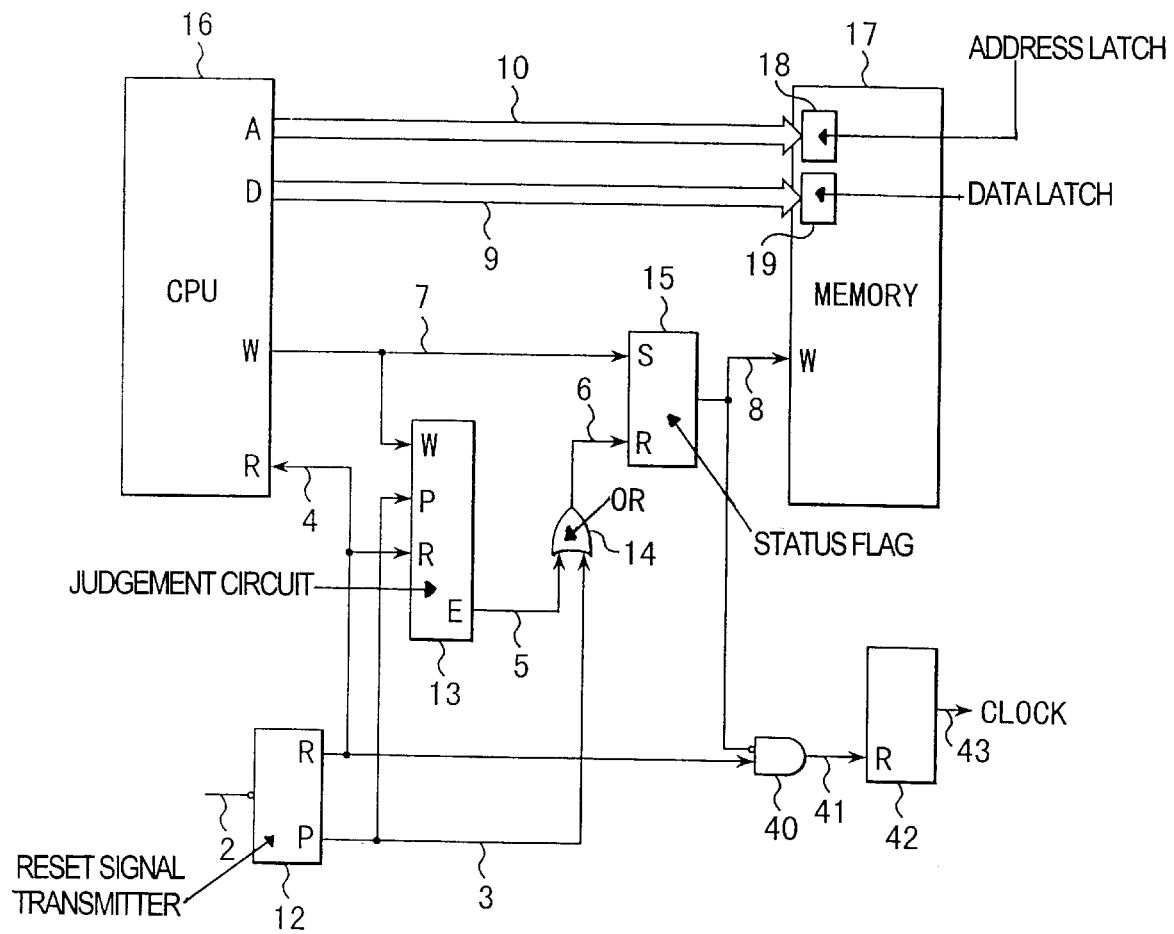
FIG. 7 is a block diagram of a circuit for controlling writing data into a memory in accordance with the second embodiment of the present invention.

FIG. 7 is a block diagram of a circuit for controlling writing data into a memory in accordance with the second embodiment. The illustrated circuit is different from the circuit in accordance with the first embodiment in that the illustrated circuit is additionally provided with a clock oscillator 42 and means for stopping oscillation of the clock oscillator 42 in order to save power consumption when an external reset factor is generated. Specifically, the above mentioned means is comprised of a logic gate 40 for transmitting a signal 41 by which oscillation of the clock oscillator 42 is stopped.

Herein, assume that when the reset factor 2 is generated, the clock oscillator 42 is made to stop oscillating only by the reset signal 4. In such an arrangement, if the reset factor 2 is generated while data is being written into the memory 17, a clock 43 is stopped, and thus, it would not be possible to properly complete writing data into the memory 17. In order to avoid this problem, the second embodiment uses a signal 41 comprising logical product of the reset signal 4 and logical negation of the memory-writing allowance signal 8, in order to stop oscillation of the clock oscillator 42.

Figure 8:
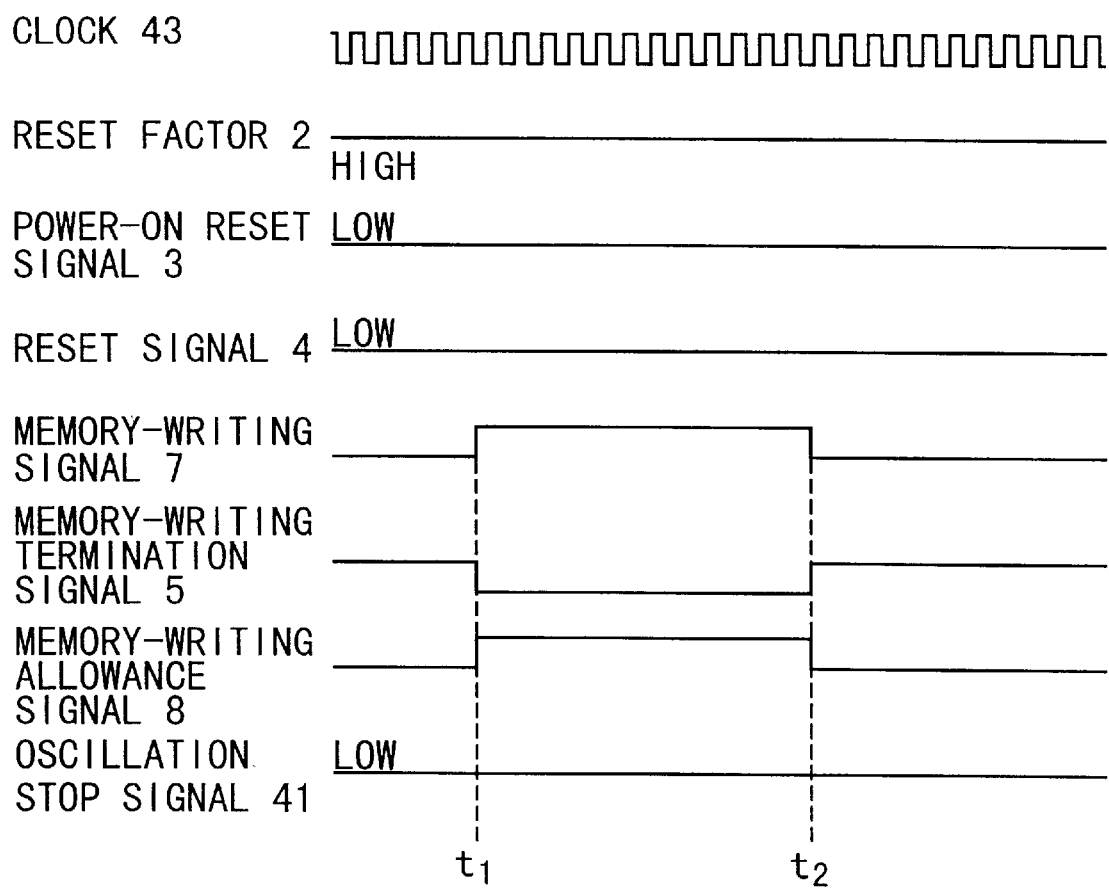
FIG. 8 illustrates wave-forms of signals in the circuit illustrated in FIG. 7, to be found when,a reset factor is not generated.

The circuit illustrated in FIG. 7 operates as follows. FIG. 8 illustrates wave-forms of the signals to be found in the same condition as that of FIG. 4. There are additionally provided the clock 43 transmitted from the clock oscillator 42, and the signal 41 for stopping oscillation of the clock oscillator 42, relative to the wave-forms illustrated in FIG. 4. Since the clock oscillator 42 is not caused to stop its oscillation in the condition same as that of FIG. 4, the signals common in FIGS. 4 and 8 have the same wave-forms, namely, accomplish the same function.

Figure 9A:
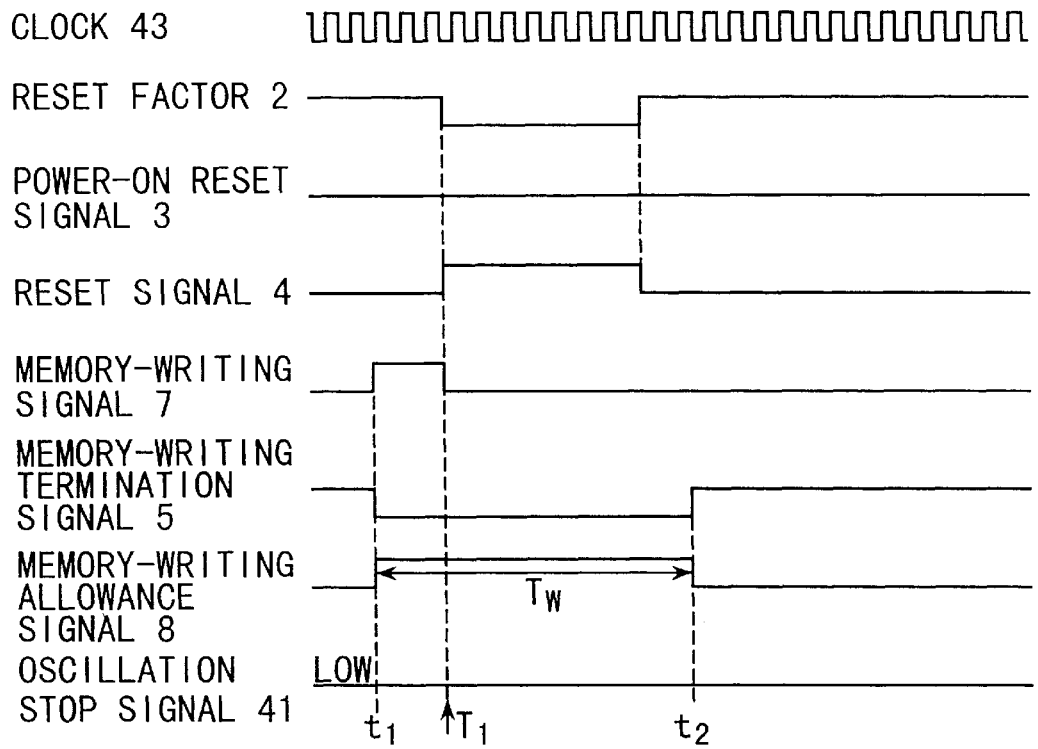
FIG. 9A illustrates wave-forms of signals in the circuit illustrated in FIG. 7, to be found when a reset factor is generated.

FIG. 9A illustrates wave-forms of the signals to be found when the reset factor 2 is generated in the same condition as that of FIG. 5A. Since the clock oscillator 42 is not caused to stop its oscillation in this case, the signals common in FIGS. 5A and 9A have the same wave-forms, namely, accomplish the same function.

Figure 9B:
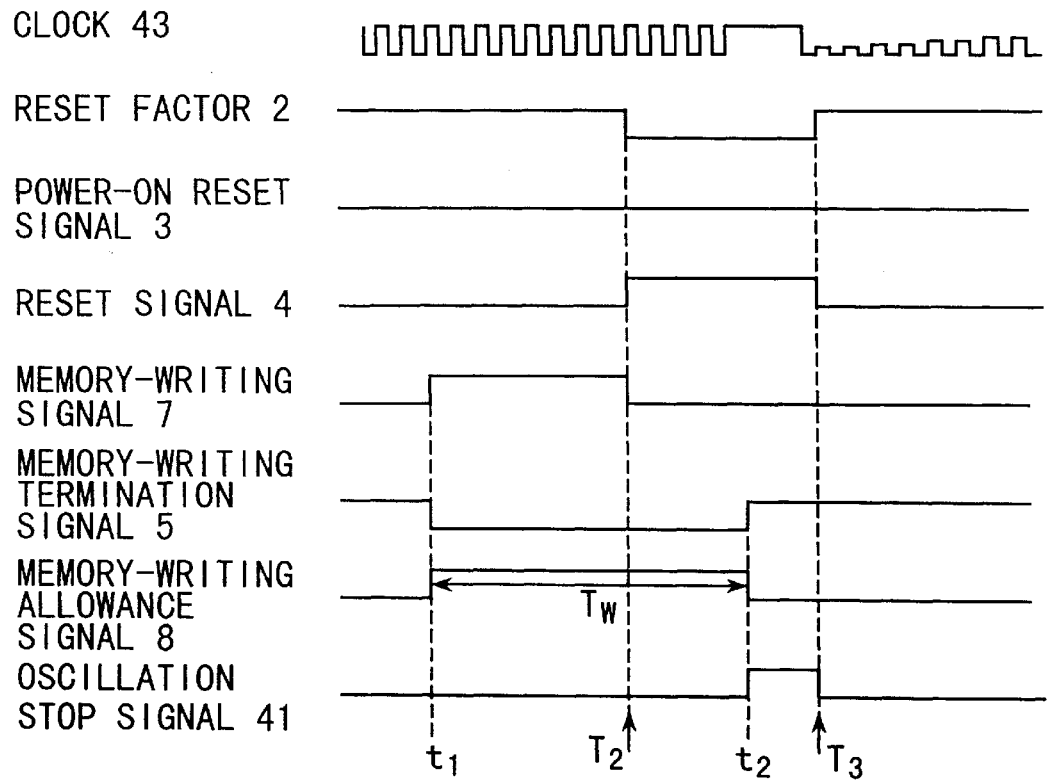
FIG. 9B illustrates wave-forms of signals in the circuit illustrated in FIG. 7, to be found when a reset factor is generated and lasts after writing has been completed.

FIG. 9B illustrates wave-forms of the signals to be found when the reset factor 2 is generated in the same condition as that of FIG. 5B. In FIG. 9B, writing data into the memory 17 is completed at time $t_2$ at which the reset factor or negative logic 2 is valid, and in addition, the clock oscillator 42 stops its oscillation also at the time $t_2$. Hence, the clock 43 is stopped at the time $t_2$. Thereafter, when the reset factor 2 is invalidated at time $T_3$, the clock oscillator 42 commences to oscillate.

FIG. 9B illustrates wave-forms of the signals to be found when the reset factor 2 is generated in the same condition as that of FIG. 5B. In FIG. 9B, writing data into the memory 17 is completed at time $t_2$ at which the reset factor or negative logic 2 is valid, and in addition, the clock oscillator 42 stops its oscillation also at the time $t_2$. Hence, the clock 43 is stopped at the time $t_2$. Thereafter, when the reset factor 2 is invalidated at time $T_3$, the clock oscillator 42 commences to oscillate.

Figure 10:
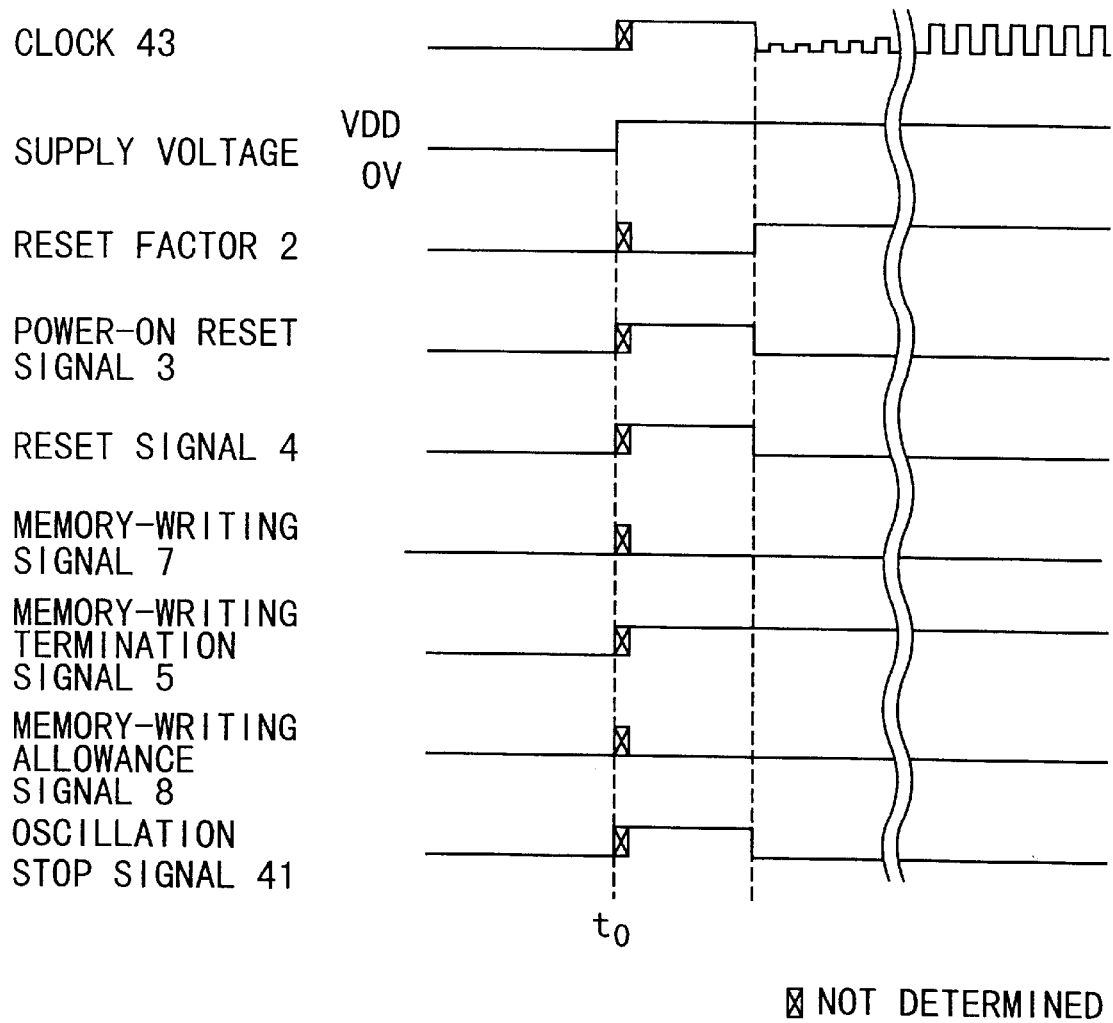
FIG. 10 illustrates wave-forms of signals in the circuit illustrated in FIG. 7, to be found when power supply is just introduced thereinto.

FIG. 10 illustrates wave-forms of the signals to be found in the same condition as that of FIG. 6, namely, when power is applied thereto. When the reset signal 4 transmitted from the reset signal transmitter 12 becomes invalid, the clock oscillator 42 commences oscillation.

Even though the above mentioned second embodiment has a function of stopping oscillation of the clock oscillator 42 in order to save power consumption when an external reset factor is generated, the circuit in accordance with the second embodiment provides the same effects as those of the first embodiment, when a reset factor and operation of writing data into a memory coexist with each other. In addition, it is possible to stop oscillation of the clock oscillator 42, if writing data into a memory is completed while the reset factor 2 is valid. Hence, it is possible to lower power consumption of a micro-computer including the circuit in accordance with the instant embodiment.

Figure 11:
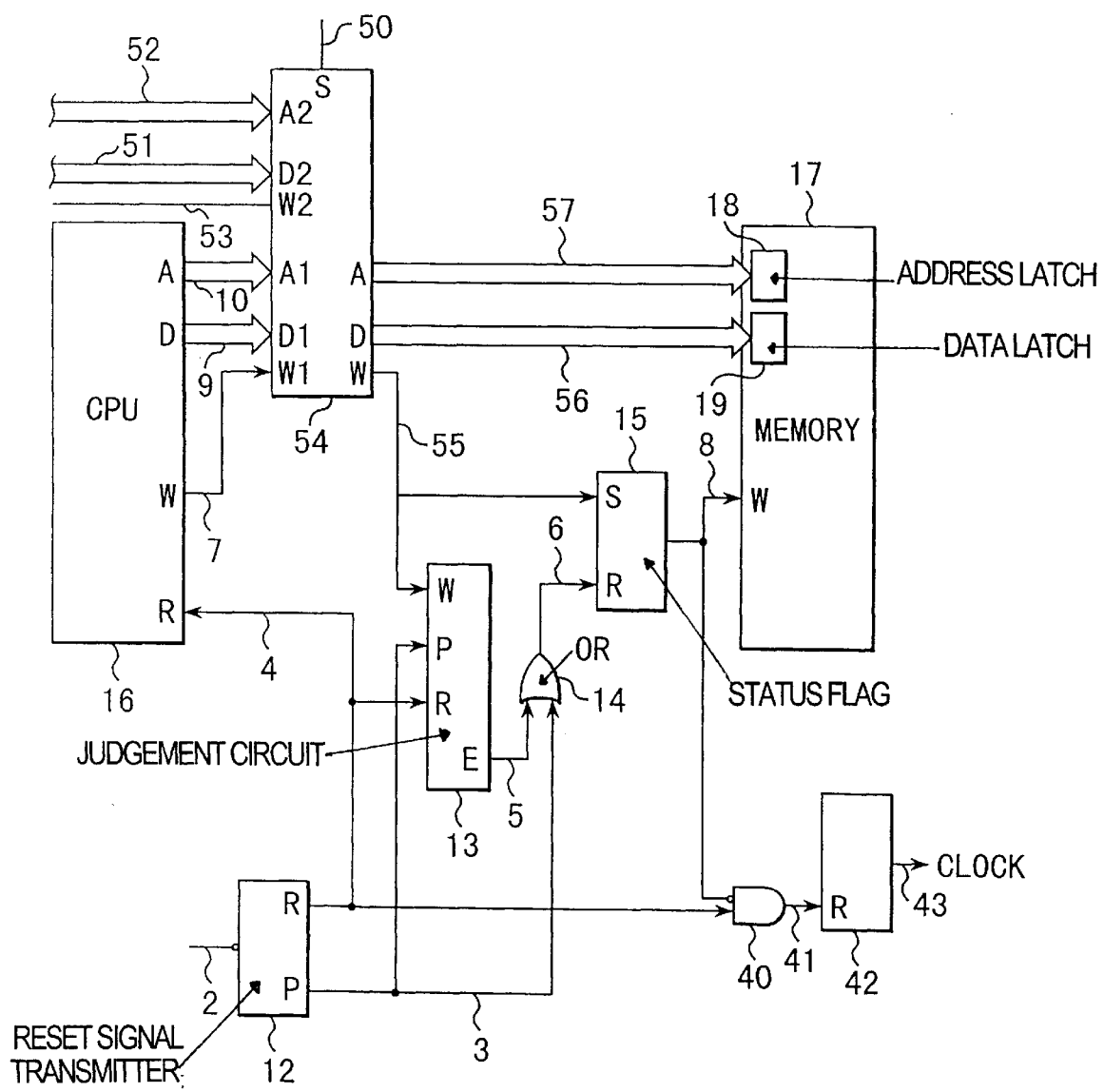
FIG. 11 is a block diagram of a circuit for controlling writing data into a memory in accordance with the third embodiment of the present invention.

FIG. 11 illustrates a circuit in accordance with the third embodiment. The illustrated circuit is provided with a selector 54 between CPU 16 and the memory 17. The selector 54 receives a selection signal 50, and selects one of combinations A and B in accordance with the received selection signal 50: the combination A includes the address signal 10, the data signal 9, and the memory-writing signal 7 all transmitted from CPU 16; and the combination B includes an address signal 52, a data signal 51, and a memory-writing signal 53 transmitted from other circuit units or from outside. After selecting one of the combinations A and B, the selector 54 connects the signals included in the selected combination with an address signal 57, a data signal 56, and a memory-writing signal 55. The other structure is the same as that of the circuit illustrated in FIG. 7.

The operation of the circuit illustrated in FIG. 11 is basically the same as the operation of the circuit illustrated in FIG. 7, and additionally includes selection of one of the above mentioned combinations A and B by the selector 54 in accordance with the selection signal 50. Thus, if the reset factor 2 is generated while data is being written into the memory 17 from a circuit unit which is not be able to be reset or from outside, data having been stored in the data latch 19 before the reset factor 2 had been generated is written into an address having been stored in the address latch 18 before the reset factor 2 had been generated. That is, even if the reset factor 2 is generated while data is being written into the memory 17 by using address and data provided from circuits or units other than CPU 16, it is ensured to complete writing the data into the memory 17.

As explained above, the circuit in accordance with the third embodiment provides the same effect as that of the second embodiment with respect to writing data into the memory 17 by using address and data provided from circuits or units other than CPU 16.

While the circuit in accordance with the present invention have been described in connection with the preferred embodiments, the invention provides advantageous effects as follows.

The operation of the circuit illustrated in FIG. 11 is basically the same as the operation of the circuit illustrated in FIG. 7, and additionally includes selection of one of the above mentioned combinations A and B by the selector 54 in accordance with the selection signal 50. Thus, if the reset factor 2 is generated while data is being written into the memory 17 from a circuit unit which is not be able to be reset or from outside, data having been stored in the data latch 19 before the reset factor 2 had been generated is written into an address having been stored in the address latch 18 before the reset factor 2 had been generated. That is, even if the reset factor 2 is generated while data is being written into the memory 17 by using address and data provided from circuits or units other than CPU 16, it is ensured to complete writing the data into the memory 17.

As explained above, the circuit in accordance with the third embodiment provides the same effect as that of the second embodiment with respect to writing data into the memory 17 by using address and data provided from circuits or units other than CPU 16.

The first advantageous effect is that it is ensured to complete writing data into a memory, even if a reset factor is generated while data is being written into a memory. This is because the status flag stores memory-writing condition, and the status flag is not reset by the reset signal. In addition, as the judgement circuit which judges whether writing data into a memory is completed or not is not reset by the reset signal, it is always possible to properly complete writing data into a memory.

The second advantageous effect is that, even if a reset signal is input to the circuit while data is being written into a memory, it is possible to know which data is written into which address, after a reset was carried out. The reason is that since the address latch and the data latch of the memory are not reset by the reset signal, an address stored in the address latch just before a reset has been carried out is retained in the address latch even after a reset was carried out.

The third advantageous effect is that even if a reset factor is generated while data is being written into a memory, circuits other than circuits concerning memory-writing are reset at the same time when the reset factor is generated. The reason is that the judgement circuit and the status flag can be reset only by the power-on reset signal, and the judgement circuit and the status flag controls the memory-writing allowance signal while a reset is being carried out, resulting in that the other circuits can be released from the operation of writing data into a memory.

The fourth advantageous effect is that if the circuit is provided with a function of lowering power consumption by stopping oscillation of an oscillator during a reset, the circuit can provide the above mentioned first to third advantageous effects, even if a reset factor is generated while data is being written into a memory. The reason is that as the status flag is not reset by the reset signal, the oscillator is able to be kept to oscillate by using the signal while data is being written into a memory.

The fifth advantageous effect is that the above mentioned first to fourth effects are ensured for circuits which are unnecessary to be reset, other than CPU, and for operation of writing data into a memory from external circuits or units. The reason is that the circuit in accordance with the invention is useful for operation of writing data into a memory from any other circuits for the reason as set forth in the first advantageous effect.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-223855 filed on Aug. 26, 1996 including specification, claims, drawings and summary is incorporated herein by reference in its entirety.

What is claimed is:

1. A circuit for controlling writing data into an address of a memory, said data and address being transmitted from a central processing unit, said circuit comprising:

(a) a judgement circuit for judging whether writing data into an address is completed, said judgement circuit invalidating a first signal transmitted therefrom while a second signal introduced thereto from said central processing unit is valid, and validating said first signal only if a period of time necessary for writing data into an address has passed and if a reset signal is received by said judgement circuit while said second signal is valid; said second signal being a signal instructing to write data into an address and said first signal being a signal instructing to terminate writing data into an address;

(b) a status flag for transmitting a third signal which is a signal to allowing write data into an address, said status flag being set on receiving said second signal from said central processing unit thereby validating said third signal, and being reset on receiving a valid first signal from said judgement circuit thereby invalidating said third signal;

(c) address latch and data latch latching am address transmitted from said central processing unit and data to be written into the thus transmitted address, respectively, said address and data latches writing said data into said address by valid third signal, wherein even if said reset signal is received by said judgement circuit, said address and data latches retain address and data that exist therein before said reset signal is received; and (d) a reset signal transmitter transmittance a reset signal to reset circuit elements required to be reset other than said judgement circuit, said status flag and said address and data latches.

2. The circuit as set forth in claim 1, wherein said when power circuit is reset when power supply is introduced thereinto.

3. The circuit as set forth in claim 1, wherein said status flag is reset when power supply is introduced thereinto.

4. The circuit as set forth in claim 1, wherein said reset signal transmitter transmits a power-on reset signal to said judgement circuit and said status flag to thereby reset them when power supply is introduced thereinto.

5. The circuit as set forth in claim 4, further comprising, an OR circuit for calculating logical sum of said first signal and said power-on reset signal, and transmitting a fourth signal representing said logical sum to said status flag, said fourth signal being valid when said first signal is valid.

6. The circuit as set forth in claim 5, wherein said status flag validates said third signal on receiving valid second signal, and invalidates said third signal on receiving valid fourth signal.

7. The circuit as set forth in claim 1, wherein said judgement circuit includes a timer for measuring said period of time necessary for writing data into an address.

8. The circuit as set forth in claim 1, further comprising a clock oscillator and means for stopping oscillation of said clock oscillator while a reset factor is generated.

9. The circuit as set forth in claim 8, wherein, said means calculates logical product of said third signal having been invalidated and said reset signal, and transmits a signal for stopping oscillation of said clock oscillator while a reset factor is generated.

10. The circuit as set forth in claim 1, further comprising a selector for selecting one of first and second combinations: first combination comprising an address signal, a data signal, and said second signal all transmitted to said selector from said central processing unit; second combination comprising an address signal, a data signal, and a signal corresponding to said second signal all transmitted from other semiconductor integrated circuit units or from outside.

* * * * *

UNITED STATES PATENT AND TRADEMARK OFFICE
CERTIFICATE OF CORRECTION

PATENT NO.   : 6,119,211
DATED        : September 12, 2000
INVENTOR(S)  : Shigeharu Kaneko and Takao Honda It is certified that error appears in the above-identified patent and that said Letters Patent is hereby corrected as shown below:

Column 10, claim 1,
Line 51, change "am" to -- an --.

Column 10, claim 2,
Line 65, change "when power circuit" to -- judgment circuit --.

Signed and Sealed this

Nineteenth Day of February, 2002

Attest:

JAMES E. ROGAN
Attesting Officer    Director of the United States Patent and Trademark Office